United States Patent
Chanemougame et al.

(10) Patent No.: US 11,574,845 B2
(45) Date of Patent: Feb. 7, 2023

(54) APPARATUS AND METHOD FOR SIMULTANEOUS FORMATION OF DIFFUSION BREAK, GATE CUT, AND INDEPENDENT N AND P GATES FOR 3D TRANSISTOR DEVICES

(71) Applicant: TOKYO ELECTRON LIMITED, Tokyo (JP)

(72) Inventors: Daniel Chanemougame, Niskayuna, NY (US); Lars Liebmann, Mechanicville, NY (US); Jeffrey Smith, Clifton Park, NY (US); Anton deVilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 100 days.

(21) Appl. No.: 16/848,638

(22) Filed: Apr. 14, 2020

(65) Prior Publication Data
US 2021/0043522 A1    Feb. 11, 2021

Related U.S. Application Data

(60) Provisional application No. 62/883,871, filed on Aug. 7, 2019.

(51) Int. Cl.
*H01L 21/8238*    (2006.01)
*H01L 27/092*    (2006.01)

(52) U.S. Cl.
CPC ......... *H01L 21/823878* (2013.01); *H01L 21/823871* (2013.01); *H01L 27/092* (2013.01)

(58) Field of Classification Search
CPC ......... H01L 27/0688; H01L 21/8221; H01L 27/092; H01L 27/0922; H01L 21/823871
See application file for complete search history.

(56) References Cited

U.S. PATENT DOCUMENTS 5,583,368 A * 12/1996 Kenney ............... H01L 27/0922
257/621
8,049,253 B2   11/2011 Isobe
(Continued)

FOREIGN PATENT DOCUMENTS

JP    2013-89752 A    5/2013

OTHER PUBLICATIONS

International Search Report and Written Opinion of the International Searching Authority dated Oct. 12, 2020 in PCT/US2020/039376, 11 pages.

*Primary Examiner* — John A Bodnar
(74) *Attorney, Agent, or Firm* — Oblon, McClelland, Maier & Neustadt, L.L.P.

(57) ABSTRACT

A method of manufacturing a 3D semiconductor device, the method including forming a first target structure, the first target structure including at least one upper gate, at least one bottom gate, and a dielectric separation layer disposed between and separating the at least one upper gate and the at least one bottom gate; removing material in a plurality of material removal areas in the first target structure, the plurality of material removal areas including at least one material removal area that extends through the at least one upper gate to a top of the dielectric separation layer; and forming a first contact establishing a first electrical connection to the upper gate and a second contact establishing a second electrical connection to the at least one bottom gate, such that the first contact and second contact are independent of each other.

13 Claims, 8 Drawing Sheets

(56) References Cited

U.S. PATENT DOCUMENTS

| | | |
|---|---|---|
| 8,470,688 B2 | 6/2013 | Isobe |
| 8,841,730 B2 | 9/2014 | Isobe |
| 9,123,567 B2 | 9/2015 | Radosavljevic et al. |
| 9,666,492 B2 | 5/2017 | Radosavljevic et al. |
| 10,319,646 B2 | 6/2019 | Radosavljevic et al. |
| 10,685,887 B2 | 6/2020 | Smith et al. |
| 10,784,170 B2 | 9/2020 | Radosavljevic et al. |
| 2009/0014799 A1 | 1/2009 | Isobe |
| 2012/0018808 A1 | 1/2012 | Isobe |
| 2013/0249009 A1 | 9/2013 | Isobe |
| 2013/0270512 A1 | 10/2013 | Radosavljevic et al. |
| 2015/0325481 A1 | 11/2015 | Radosavljevic et al. |
| 2017/0229354 A1 | 8/2017 | Radosavljevic et al. |
| 2019/0172755 A1 | 6/2019 | Smith et al. |
| 2019/0172828 A1 | 6/2019 | Smith et al. |
| 2019/0229022 A1* | 7/2019 | Radosavljevic et al. |
| 2020/0328210 A1* | 10/2020 | Wu .................... H01L 21/8221 |
| 2020/0411388 A1* | 12/2020 | Wu ................. H01L 21/823885 |

\* cited by examiner

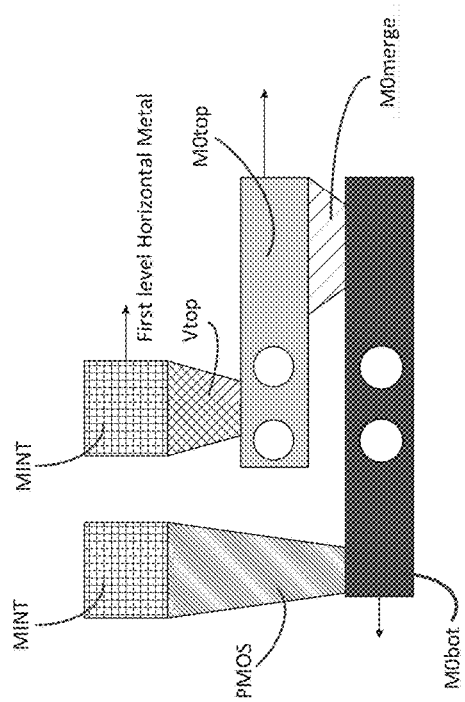
FIG. 1A
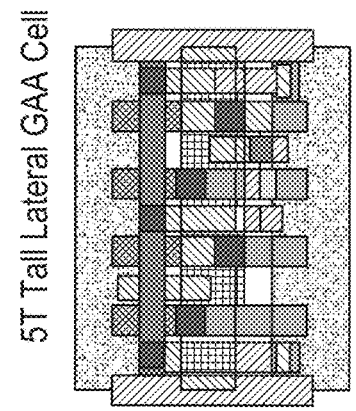
FIG. 1B
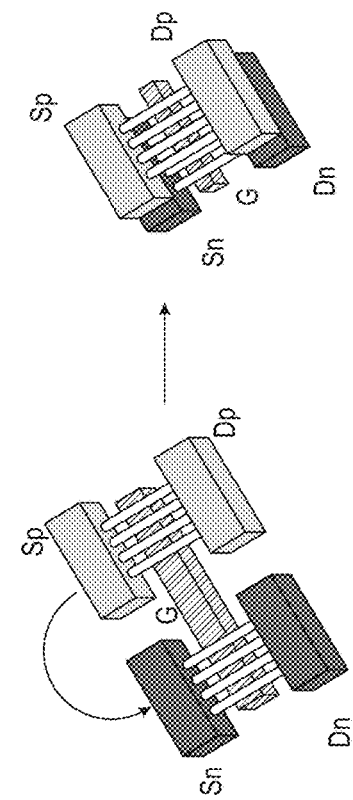
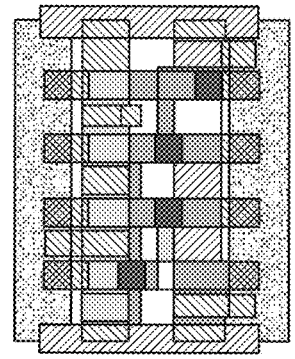
FIG. 1C

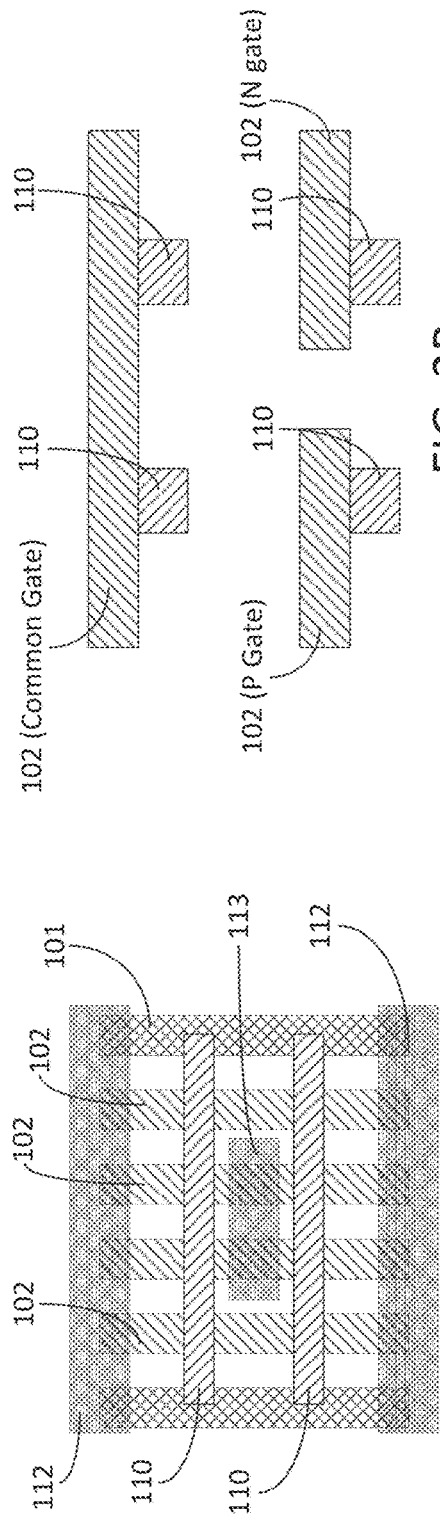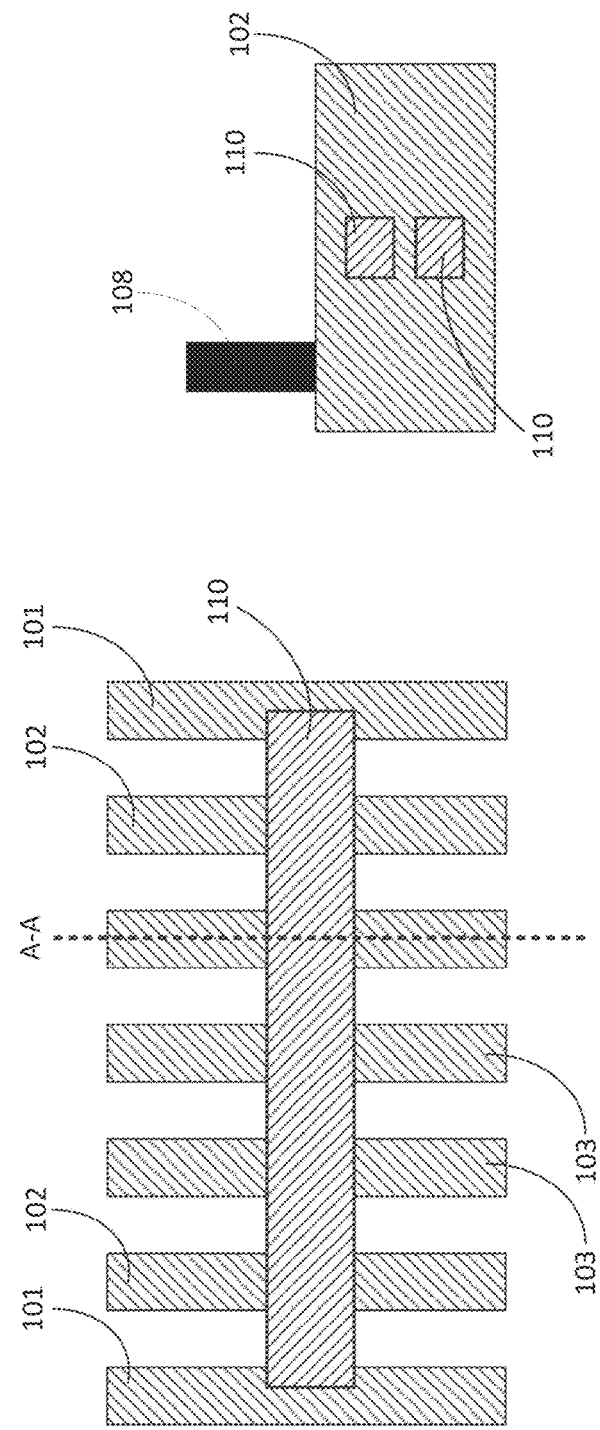

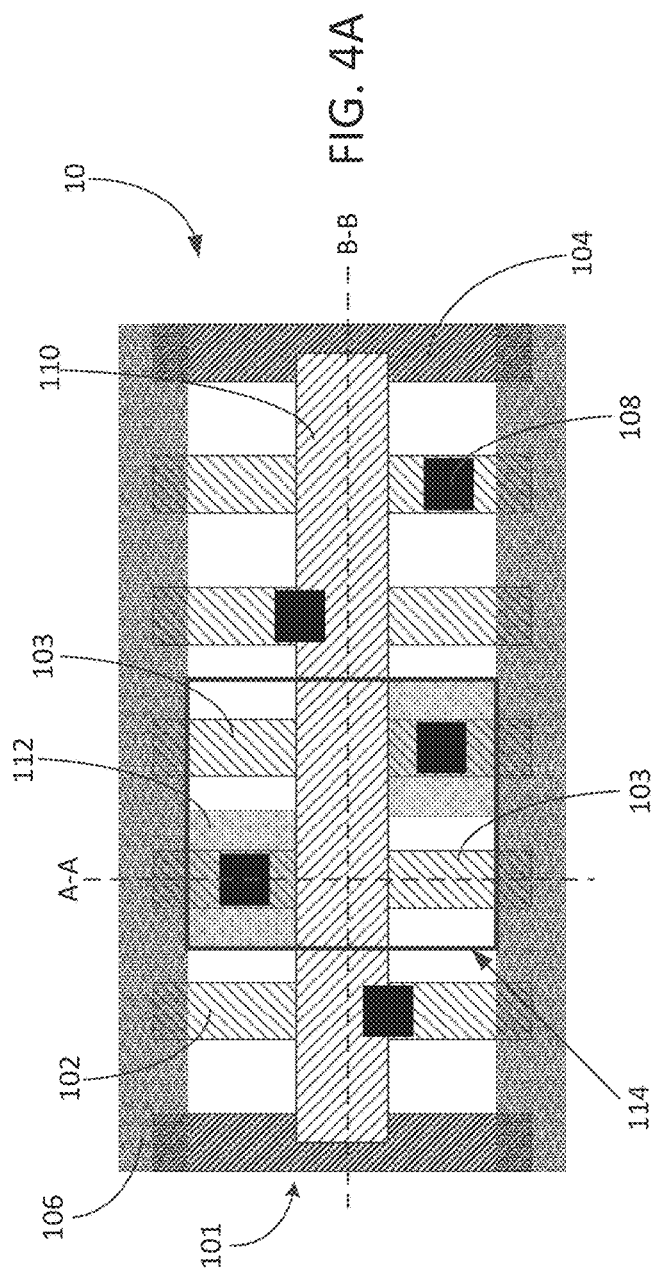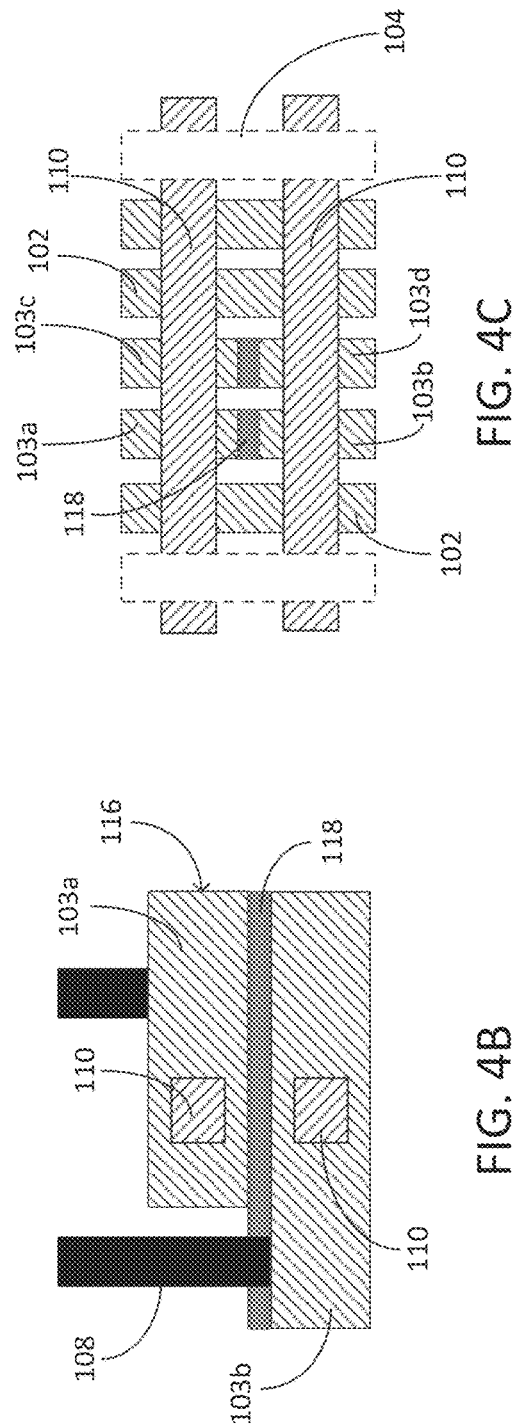
FIG. 4A
FIG. 4B
FIG. 4C

APPARATUS AND METHOD FOR SIMULTANEOUS FORMATION OF DIFFUSION BREAK, GATE CUT, AND INDEPENDENT N AND P GATES FOR 3D TRANSISTOR DEVICES

CROSS-REFERENCE TO RELATED APPLICATIONS

This present application claims the benefit of priority to U.S. Provisional Application No. 62/883,871 filed on Aug. 7, 2019, which is incorporated by reference herein in its entirety.

FIELD OF THE INVENTION

This disclosure relates to 3D semiconductor devices and methods of manufacturing semiconductor devices using micro-fabrication.

BACKGROUND OF THE INVENTION

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Conventionally, with microfabrication, transistors have been created in one plane, with wiring/metallization formed above the active device plane, and have thus been characterized as two-dimensional (2D) circuits or 2D fabrication. Conventional scaling efforts have greatly increased the number of transistors per unit area in 2D circuits, yet conventional scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult.

As conventional 2D scaling is showing rapidly reduced return on investment, the semiconductor industry is looking to the 3rd dimension to maintain node-to-node improvement in power-performance-area-cost (PPAC). A very promising approach to using the vertical axis in improving transistor density is a new device architecture known as Complementary Field Effect Transistor (CFET). In the CFET approach a logic cell is essentially folded so that the n-device falls on-top of the p-device (or p-device on the n-device) while sharing a common gate, as illustrated in FIGS. 1A, 1B, and 1C. Folding a logic cell (N over P) can result in about 17% area savings.

However, the state of the current art lacks the further cost savings and design efficiency of the apparatus and methods described below.

SUMMARY OF THE INVENTION 3D semiconductor devices and methods of manufacturing 3D semiconductor devices using micro-fabrication In one exemplary aspect, a method of manufacturing a 3D semiconductor device includes forming a first target structure, the first target structure including at least one upper gate, at least one bottom gate, and a dielectric separation layer disposed between and separating the at least one upper gate and the at least one bottom gate; removing material in a plurality of material removal areas in the first target structure, the plurality of material removal areas including at least one material removal area that extends through the at least one upper gate to a top of the dielectric separation layer; and forming a first contact establishing a first electrical connection to the upper gate and a second contact establishing a second electrical connection to the at least one bottom gate, such that the first contact and second contact are independent of each other.

In one exemplary aspect, the removing of material includes removing material in the plurality of material removal areas via an etching process.

In one exemplary aspect, the removing of material in the plurality of material removal areas occurs at a same time in each material removal area via a single etching process.

In one exemplary aspect, the removing of material in the plurality of material removal areas creates at least one diffusion break, at least one vertical cut, or at least one lateral cut.

In one exemplary aspect, the at least one diffusion break is a single diffusion break that cuts entirely through at least one dummy gate of the first target structure.

In one exemplary aspect, the at least one diffusion break extends perpendicularly to the at least one lateral cut.

In one exemplary aspect, the first target structure further includes at least one common gate spaced from and parallel to both the at least one upper gate and the at least one bottom gate, and the at least one lateral cut extends downward through the common gate, the at least one upper gate, and the at least one bottom gate to form terminations of each of the respective gates.

In one exemplary aspect, the method further includes forming the first target structure further includes forming the at least one bottom gate via metallization; depositing a dielectric material on top of the at least one bottom gate to form the dielectric layer; and forming the at least one upper gate via metallization.

In one exemplary aspect, the at least one upper gate includes a first upper gate and a second upper gate, wherein the at least one vertical cut includes a first vertical cut and a second vertical cut, and wherein the first vertical cut is formed in the first upper gate and the second vertical cut is formed in the second upper gate.

In one exemplary aspect, the first vertical cut and second vertical cut are formed on opposite sides of the first target structure.

In one exemplary aspect, the first contact and second contact extend from a top of the first target structure to the at least one upper gate and at least one bottom gate, respectively.

In one exemplary aspect, the at least one upper gate is part of an N-type field-effect-transistor (FET) and the at least one bottom gate is part of a P-type FET; or the at least one upper gate is part of an P-type FET and the at least one bottom gate is part of an N-type FET.

In one exemplary aspect, the first target structure further includes at least one common gate, and the method further includes forming a third contact establishing a third electrical connection to the at least one common gate.

In one exemplary aspect, the forming of the third contact, the forming of the first contact, and the forming of the second contact occur simultaneously.

In one exemplary aspect, a 3D semiconductor device includes at least one upper gate; at least one bottom gate; a dielectric layer disposed between and separating the at least one upper gate and the at least one bottom gate; a first contact establishing an electrical connection to the at least one upper gate; and a second contact establishing an electrical connection to the at least one bottom gate, wherein the first contact and the second contact are independent from each other.

In one exemplary aspect, the electrical connection to the at least one upper gate is independent from the electrical connection to the at least one bottom gate.

In one exemplary aspect, the at least one upper gate is stacked above the at least one bottom gate with the dielectric layer disposed between.

In one exemplary aspect, the 3D semiconductor device further includes at least one common gate; and at least one third contact establishing an electrical connection to the at least one common gate, wherein the first contact, the second contact, and the third contact each extend downward to a top surface of each of the respective gates.

In one exemplary aspect, the at least one upper gate is part of an N-type FET and the at least one bottom gate is part of a P-type FET, or the at least one upper gate is part of a P-type FET and the at least one bottom gate is part of an N-type FET.

In one exemplary aspect, the at least one common gate is part of a complimentary field-effect-transistor (CFET) that includes an N-type FET and a P-type FET.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A illustrates the basic concept of how to obtain a CFET device by folding a conventional, side by side, device layout;

FIG. 1B illustrates a cross sectional view of a conventional folded CFET device;

FIG. 1C illustrates with top-down layout views how a conventional, side by side, 6T layout (left) can be folded to obtain a 5T CFET layout (right);

FIG. 2A illustrates a conventional, side by side, CMOS logic cell layout with shared, common N and P gates and with independent N and P gates and according to exemplary aspects of the disclosure;

FIG. 2B illustrates a cross section of the CMOS logic cell of FIG. 2A and according to exemplary aspects of the disclosure;

FIG. 3A illustrates a CFET CMOS logic cell with shared, common N and P gates, and with independent N and P gates and according to exemplary aspects of the disclosure;

FIG. 3B illustrates a cross section of the CFET CMOS logic cell of FIG. 3A and according to exemplary aspects of the disclosure;

FIG. 4A illustrates a "birds-eye-view" layout for a CFET CMOS logic cell in which both common and independent N & P gates are required and according to exemplary aspects of the disclosure;

FIG. 4B illustrates an illustrative side view along line A-A of the CFET CMOS logic cell of FIG. 4A and according to exemplary aspects of the disclosure;

FIG. 4C illustrates an illustrative side view along line B-B of the CFET CMOS logic cell of FIG. 4A and according to exemplary aspects of the disclosure;

DETAILED DESCRIPTION OF THE PREFERRED EMBODIMENTS

Figure 5A:
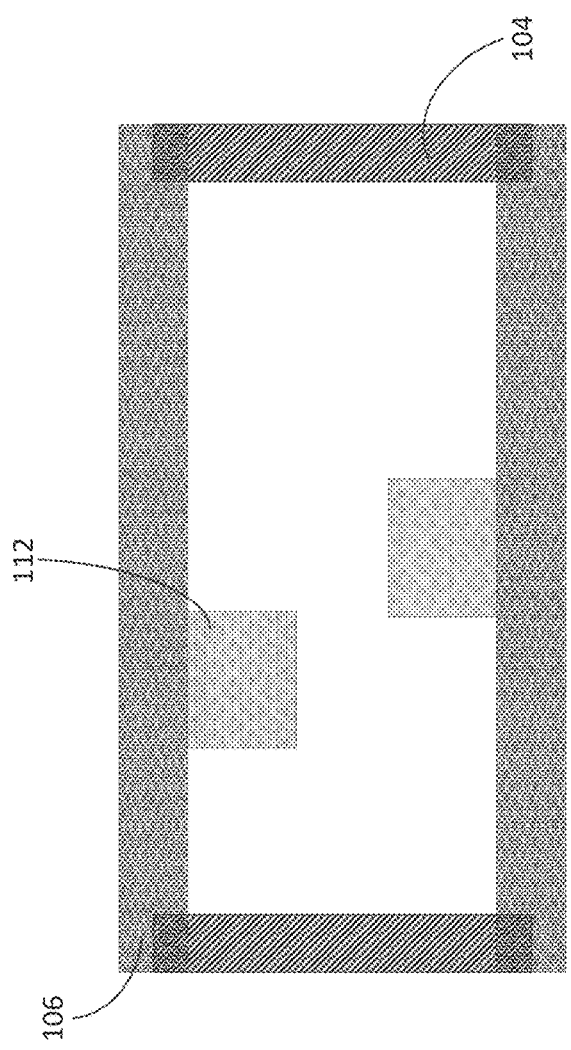
FIG. 5A illustrates a "birds-eye-view" layout of the patterning steps used to create the structure of the cell of FIGS. 4A-4C and according to exemplary aspects of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above" upper and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

"Substrate" or "target substrate" or "structure" or "target structure" as used herein generically refers to an object being processed in accordance with the invention. The substrate or structure may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

In one exemplary aspect, the semiconductor device and method of manufacturing the semiconductor device described herein have both common and independent N and P gates in the same logic cell design. This provides an efficient design for SRAM and logic standard cells. Techniques and examples described herein also relate to a method of fabrication that enables this beneficial functionality in a CFET platform while optimizing process complexity and cost. The exemplary aspects described herein combine formation of independent bottom and upper gates with formation, at the cell boundaries, of a single diffusion break and the poly lines terminations in order to form gates. According to one exemplary aspect, a set of process steps is described which enable simultaneous formation of these three distinct features so as to lower complexity, while enabling common gates with a shared contact and independent gates with independent contacts.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

From a design and performance perspectives, folding the two complementary devices on top of each other provides substantial scaling benefits. As can be appreciated, however, there is an additional complexity and burden placed on a corresponding fabrication process and integration to stack one device on top of another device, with the required CFET connectivity. This extra complexity translates into increased cost of such technology, and cost is just as important as scaling and performance.

In addition, to obtain CMOS logic with a conventional integration scheme for conventional 2D designs, N and P transistors are placed side-by-side, and share a common gate to achieve the complementary function that made CMOS so successful. While the majority of conventional 2D designs include N and P transistors sharing a common gate, there are some critical logic cells that require the N and P gates to be independent from each other, as shown in FIGS. 2A and 2B.

Including both independent and shared N and P gates enables significant design scaling capability and is, therefore, beneficial for advanced technology logic designs. As shown in FIG. 2A, in a 2D design it is straightforward to separate the N and P gates. FIG. 2A shows gates 102, dummy gates 101, lateral cuts 112, central cut 113, and active layers 110. For example, a shape is cut out of the gates 102 via the central cut 113 in order to disconnect the N and P gates where desired, typically in the middle of the cell. FIG. 2B shows cross-sections of the resulting common N and P gates (top of figure) and separated N and P gates (bottom of figure).

In a CFET, however, providing this functionality is more complex because the N and P devices, and their gates, are on top of each other in a 3D design—i.e. the N and P gates are no longer side-by-side. The N to P separation space must now be made in the vertical plane instead of the horizontal plane, and the bottom and upper gates need to be independently contacted by the local interconnects. It is appreciated that techniques described in accordance with the present disclosure can apply to N over P, P over N, N over N, and P over P configurations and to SRAM designs as well. For ease of explanation, the present disclosure makes non-limiting reference to CFET designs. However, the techniques described herein can apply to any semiconductor device with vertically stacked transistors.

FIGS. 3A-3B illustrate the inherent difficulty to achieve both common N and P gates and independent N and P gates in a vertically stacked CFET design. FIG. 3A illustrates a CFET CMOS logic cell with shared, common N and P gates 102, and with independent N and P gates 103. FIG. 3B depicts a cross section along line A-A illustrating the inherent difficulty to form and contact independent bottom and upper gates in a CFET. FIG. 3B shows active layers 110, gate 102, and contact 108. Two primary problems are illustrated. One challenge is how to electrically separate the gates from each other to form upper and bottom independent gates. A second challenge is how to connect each gate independently and robustly from the other. The present disclosure advantageously solves these two issues with minimum complexity in order to enable this functionality while reaching a reasonable and competitive process cost.

The present disclosure combines both common and independent N and P gates on a same cell design. This combination advantageously provides an efficient design for SRAM and logic standard cells. The techniques described herein also relate to a method of fabrication that enables this beneficial functionality in a CFET platform while optimizing process complexity and cost. The exemplary aspects described herein combine formation of independent bottom and upper gates with formation, at the cell boundaries, of a diffusion break and the poly lines terminations. According to another exemplary aspect, a set of process steps is made common to enable simultaneous formation of these three distinct features so as to lower complexity, while enabling common gates with a shared contact and independent gates with independent contacts.

Referring now to FIGS. 4A-4C, FIG. 4A shows a layout for a CFET CMOS logic cell 10 in which both common and independent N and P gates are present. The CFET CMOS logic cell 10 includes dummy gates 101 (located under the first material removal areas 104, in the direction into the page), a polycrystalline silicon ("poly") gates 102, independent N and P gates 103, first material removal areas 104, second material removal areas 106, contacts 108, active layer 110 made of silicon, third material removal areas 112, and an N/P gate separation area 114. As shown in FIG. 4A, the gates 102 extend across the cell 10 and are in multiple-layer configuration due the 3D structure of the cell. That is, as shown in FIG. 4B, the N and P type FETS are stacked on top of each other. In one exemplary aspect, the first material removal areas 104 are cuts made through the cell at the left and right ends of the cell 10 (as oriented in FIG. 4A) to separate the cell 10 from adjacent cells. The first material removal areas 104, the second material removal areas 106, and the third material removal areas 112 are respectively represented by the shapes shown in FIG. 4A; however other shapes may be used to define the respective cut areas. In one exemplary aspect, the first material removal areas 104 forms a diffusion break at right and left ends of the cell 10. In one exemplary aspect, the second material removal areas 106 extends across the poly gates 102 at the top and bottom of the cell 10 (as oriented in FIG. 4A). In one exemplary aspect, the third material removal areas 112 are located at top and bottom portions of the adjacent independent N and P gates 103. Contacts 108 establish an electrical connection to the gates 102. The electric separation area 114, delimited by the bold border in FIG. 4A, is used to separate top (N or P) and bottom (N or P) gates where required.

A final structure of the independent N and P gates 103 can be seen in FIG. 4B, as well as the terminations of the gates 102, 103 at the cell boundaries. FIG. 4B is an illustrative side view along line A-A showing a final structure of independent, isolated upper and bottom gates with their respective contact. The terminations 116 of the gates 102, created by second material removal areas 106 can be seen. FIG. 4B also shows the dielectric separation layer 118 formed between and separating the upper gate 103a and bottom gate 103b. As can be seen, the presence of dielectric separation layer 118 and the third material removal areas 112 allow the controlled removal of a portion of upper gate 103a in order to allow access to bottom gate 103b.

As seen in FIG. 4B, the contacts 108 connect to the upper gate 103a and bottom gate 103b. Thus, independent connections can be established to the upper gate 103a and bottom gate 103b. According to one exemplary aspect, the upper gate 103a is a P gate and the bottom gate 103b is an N gate and, therefore, N and P gates are independently connected in the cell 10. In another exemplary aspect, the upper gate 103a is an N gate and the bottom gate 103b is a P gate. In other exemplary aspects, the upper gate 103b and bottom gate 103b can be both P gates, both N gates, or any other combination of gate types.

FIG. 4C shows an illustrative side along line B-B along the active layer 110. In FIG. 4C, the independent upper gates 103a, 103c, and independent bottom gates 103b, 103d can be seen as well as dielectric separation layer 118 and the first material removal areas 104 at the left and right cell boundaries.

Figure 5B:
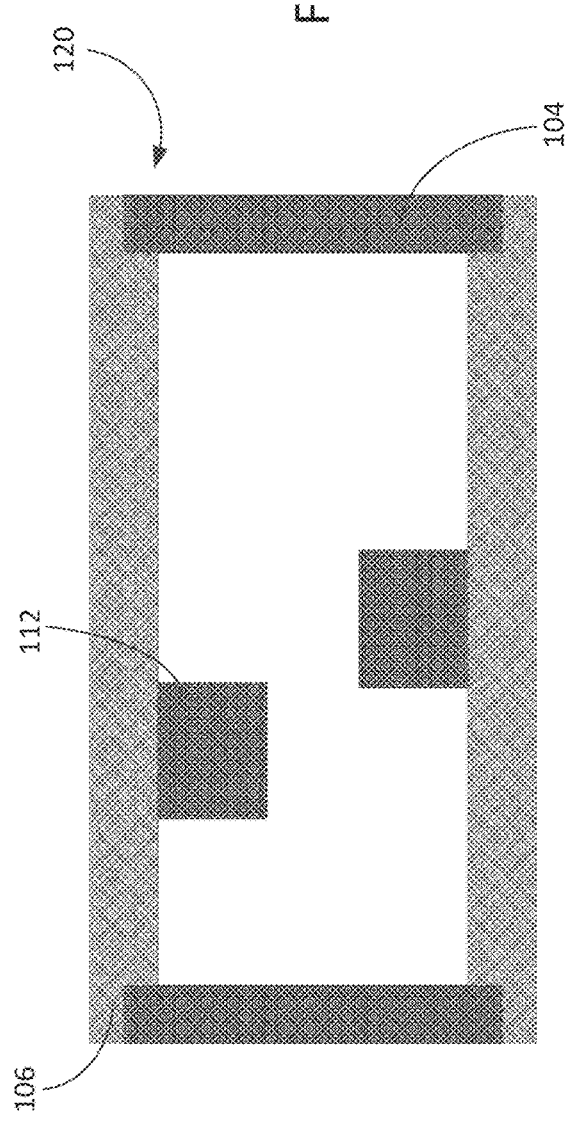
FIG. 5B illustrates a "birds-eye-view" layout of alternative patterning steps used to create the structure of the cell of FIGS. 4A-4C and according to exemplary aspects of the disclosure.

FIGS. 5A and 5B show first material removal areas 104, second material removal areas 106, and third material removal areas 112 in the cell 10 used to form the final structure shown in FIGS. 4A-4C. In other words, the structure shown in FIGS. 4A-4C can be achieved through a sequence of multiple patterning steps (e.g. first material removal areas 104, second material removal areas 106, and third material removal areas 112) where the different patterns are transferred one after the other into a memorization layer, and transferred all down into the final structure (see FIG. 5A) or all merged into a single pattern (see FIG. 5B). Thus, the patterning steps for the first material removal areas 104, the second material removal areas 106, third material removal areas 112 can be done in a multi-patterning sequence or merged in a single patterning step (shown as merged material removal area 120 in FIG. 5B).

FIGS. 6A through 8A illustrate various stages of an integrated structure during the method of manufacturing of a semiconductor device in accordance with exemplary aspects of the disclosure.

Figure 6C:
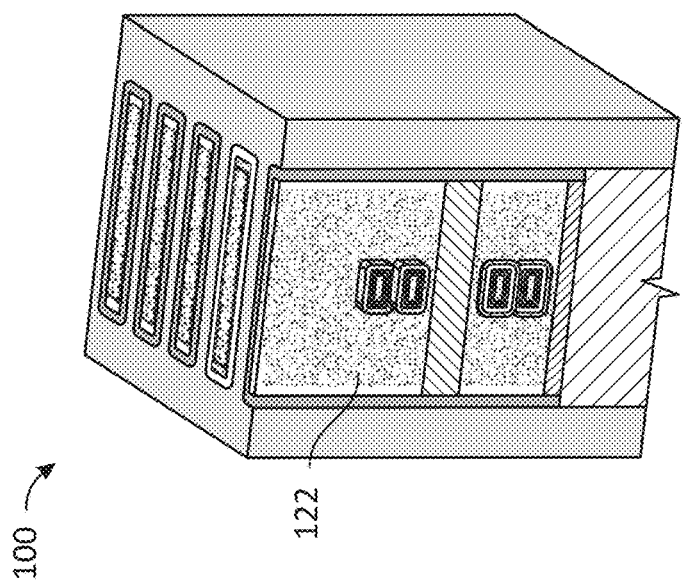
FIG. 6C illustrates an isometric view of a third stage of production during a method of producing a target integration structure according to exemplary aspects of the disclosure.
Figure 6B:
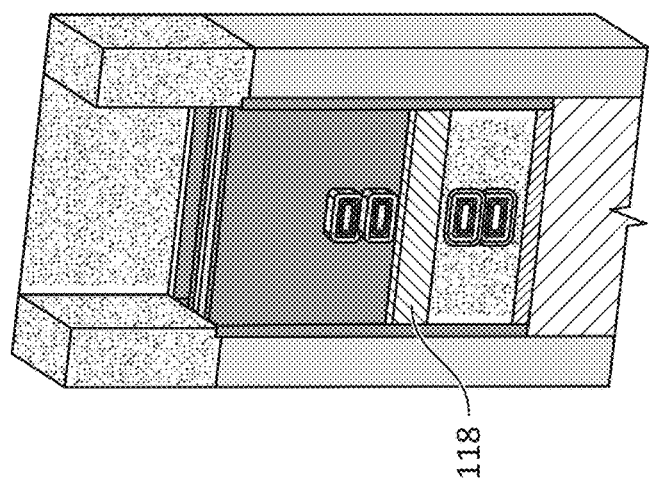
FIG. 6B illustrates an isometric view of a second stage of production during a method of producing a target integration structure according to exemplary aspects of the disclosure.
Figure 6A:
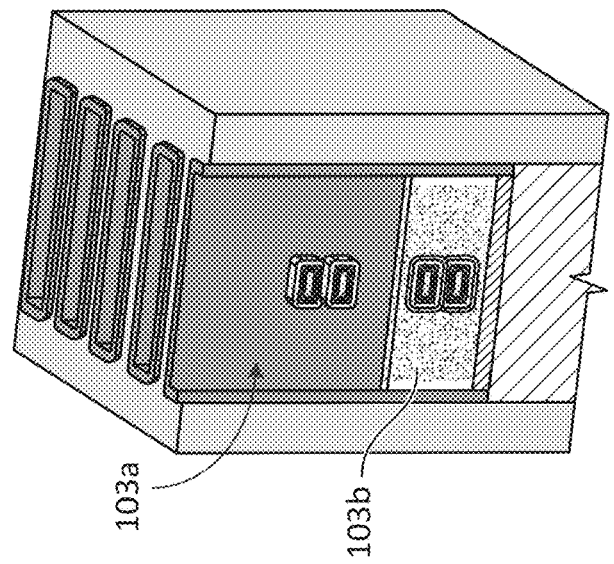
FIG. 6A illustrates an isometric view of a first stage of production during a method of producing a target integration structure according to exemplary aspects of the disclosure.

FIGS. 6A-6C depict an isometric cross-sectional views of various stages of a method of producing a first target structure 100 and according exemplary aspects of the disclosure. First, as shown in FIG. 6A, following conventional Replacement Metal Gate (RMG) and Gate All Around (GAA) steps, the bottom gates 103b are metallized. Then, as shown in FIG. 6B, areas where separation between N and P gates is needed, the dielectric layer 118 is then deposited to cap the bottom gates 103b. Finally, as shown in FIG. 6C, the upper gate 103a receives its metallization above the dielectric layer 118. One skilled in the art can appreciate how this can be accomplished with conventional patterning techniques using the N/P separation mask or other similar process. In areas outside of the separation area 114, gates 102 will be connected by metallization of the gates 102, achieving the common shared N/P gates 102.

Figure 7C:
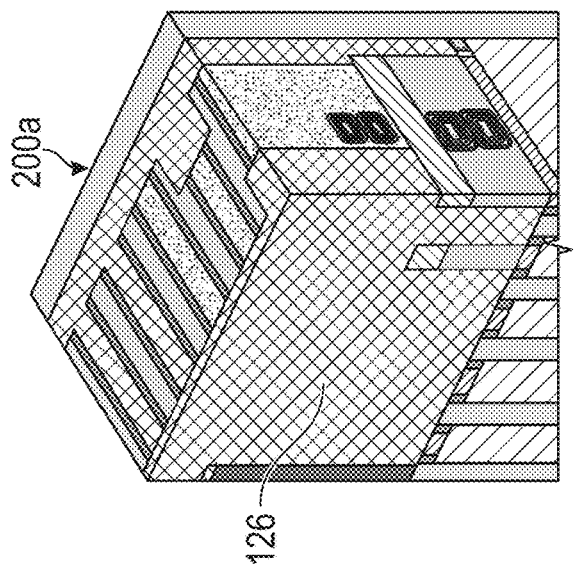
FIG. 7C illustrates an isometric view of a sixth stage of production during a method of producing a target integration structure according to exemplary aspects of the disclosure.
Figure 7B:
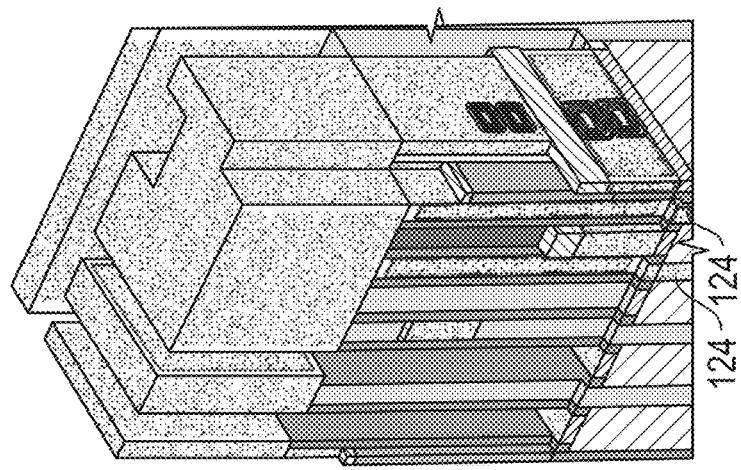
FIG. 7B illustrates an isometric view of a fifth stage of production during a method of producing a target integration structure according to exemplary aspects of the disclosure.
Figure 7A:
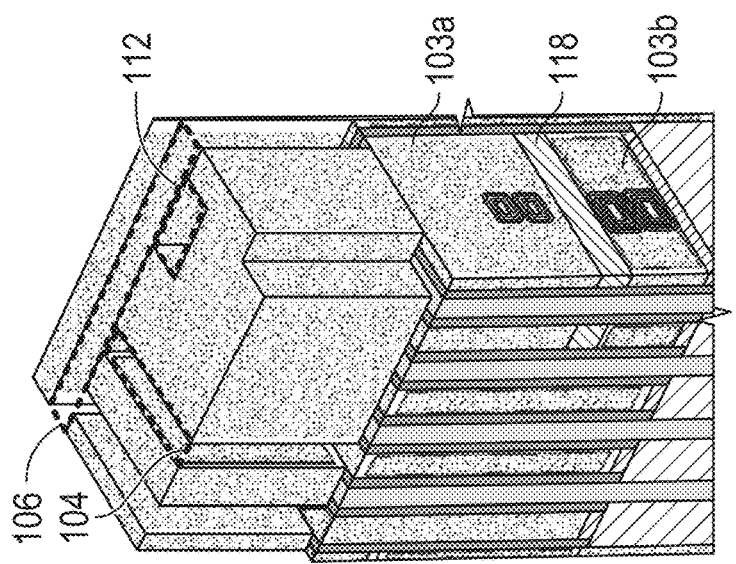
FIG. 7A illustrates an isometric view of a fourth stage of production during a method of producing a target integration structure according to exemplary aspects of the disclosure.

FIGS. 7A to 7C illustrate isometric cross-sectional view showing patterning of the first material removal areas 104, second material removal areas 106, and third material removal areas 112, with the final pattern transferred into a second target structure 200a and according to exemplary aspects of the disclosure. In an exemplary aspect, one objective of the patterning of the first material removal areas 104, second material removal areas 106, and third material removal areas 112 is to etch the gates 102 such that they are partially removed. Proceeding sequentially from FIG. 7A to FIG. 7C, a combined pattern is transferred into the target structure. In one exemplary aspect, the transfer comprises a dry etch to remove the gate and the channel materials in all three material removal areas, at the same time: the first material removal areas 104, second material removal areas 106, and third material removal areas 112 together form the independent N and P gates, gates terminations, and diffusion breaks. As seen in FIG. 7A-7C, the etch will remove all gate and channel materials if they are exposed (uncovered). Furthermore, in the independent gates areas (e.g. separation area 114), the dielectric separation layer 118 between the upper gate 103a and bottom gate 103b is also used as a selective hard mask. As such, that portion of the upper gate 103a can be robustly and reliably removed while the bottom gate 103b is fully preserved, while also at the same time the full gate materials are removed from top to bottom in two other areas (e.g. first material removal areas 104 and second material removal areas 106), as shown in FIGS. 4B and 4C. Thus, because of the steps illustrated in FIGS. 6A-6C, first material removal areas 104, second material removal areas 106, and third material removal areas 112 can be transferred in one etch which is represented by merged material removal area 120 (as described in FIG. 5B). Once the etching process is completed, the cavities created are filled with a dielectric 126 (Silicon Nitride (SiN), Silicon Oxycarbide (SiOC), or similar).

As can be seen in FIGS. 4A-4C and 7A-7C, in one exemplary aspect, the third material removal areas 112 not only uncover the gates, but also uncover a portion of the source and drain (SD) areas 124 of the transistor. This means the etch in the SD areas 124 can remove some, or all, of the dielectric layer covering the SD, potentially uncovering local interconnects as shown on FIG. 7B. Similarly, the SD local interconnects can also be capped with a dielectric layer that will act as a selective hard mask and protect the interconnects.

Figure 8A:
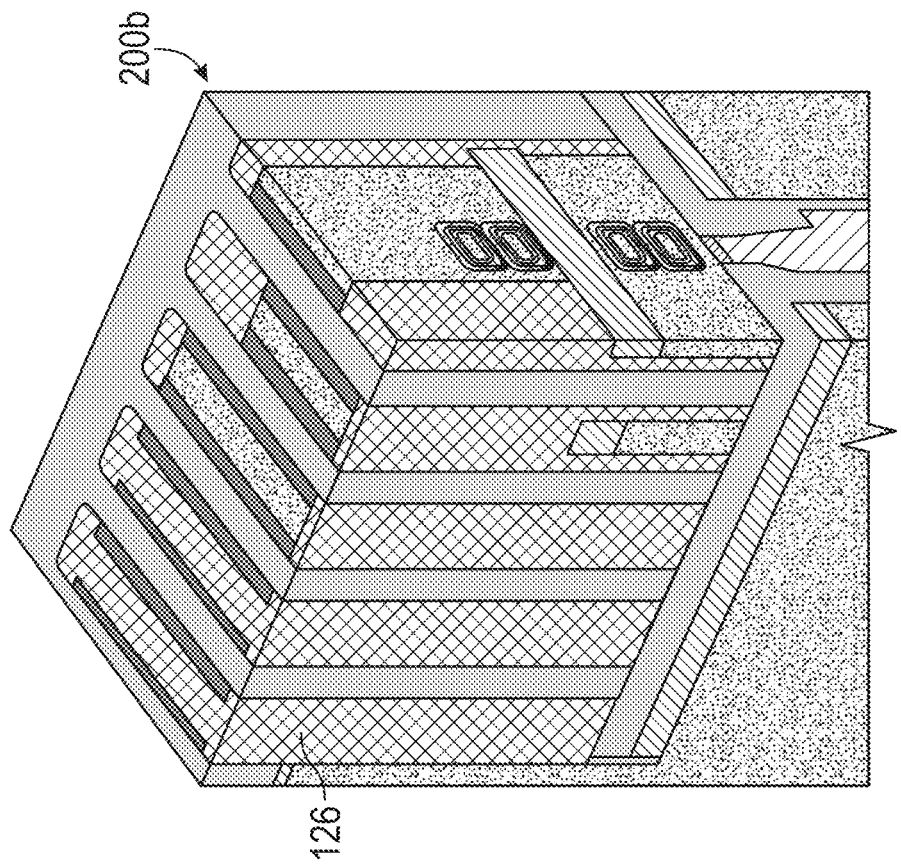
FIG. 8A illustrates an isometric view of an alternative fourth stage of production during a method of producing a target integration structure according to exemplary aspects of the disclosure.
Figure 8B:
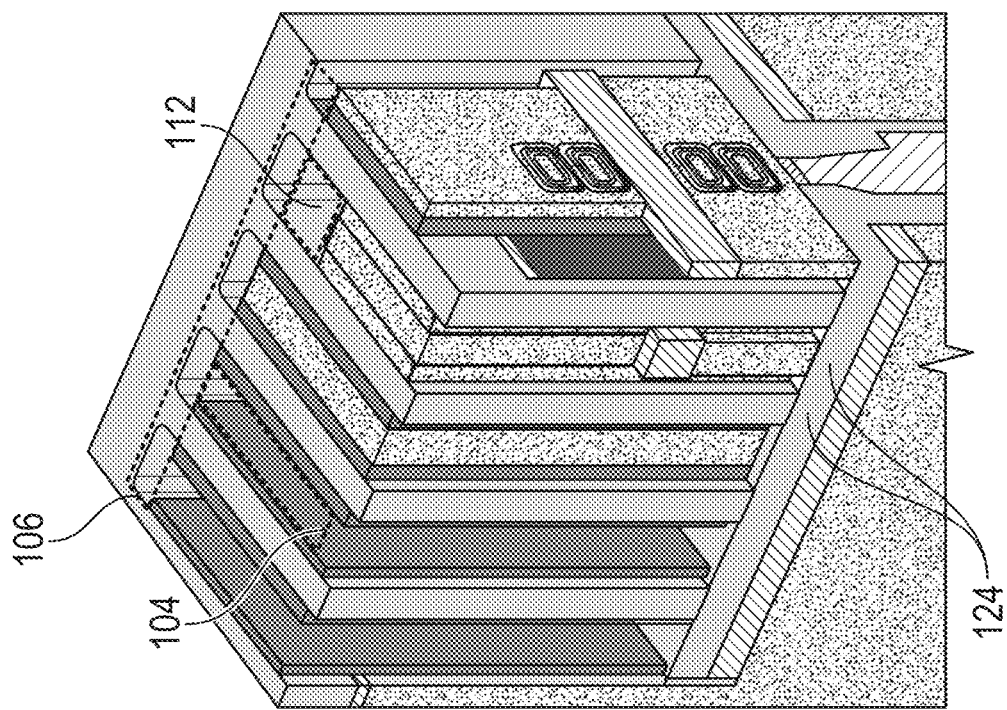
FIG. 8B illustrates an isometric view of an alternative fifth stage of production during a method of producing a target integration structure according to exemplary aspects of the disclosure.

FIGS. 8A and 8B illustrate cross-sectional substrate segments showing self-aligned patterning of the first material removal areas 104, second material removal areas 106, and third material removal areas 112, with the final pattern transferred into an alternative, second target structure 200b and according to another exemplary aspect of the disclosure. In FIGS. 8A and 8B represent a possible variant of 7B and 7C where the etch used is selective to the oxide. The self-aligned feature provides additional integration robustness by relaxing requirements for alignment performance in the x axis (as shown in FIG. 8A). In other exemplary aspects, different materials can be selected for etching and etch chemistries can be selected for desired etch selectivity. In FIG. 8B, the cuts formed in FIG. 8A are filled with a dielectric material 126 (Silicon Nitride (SiN), Silicon Oxycarbide (SiOC), or similar).

Figure 9C:
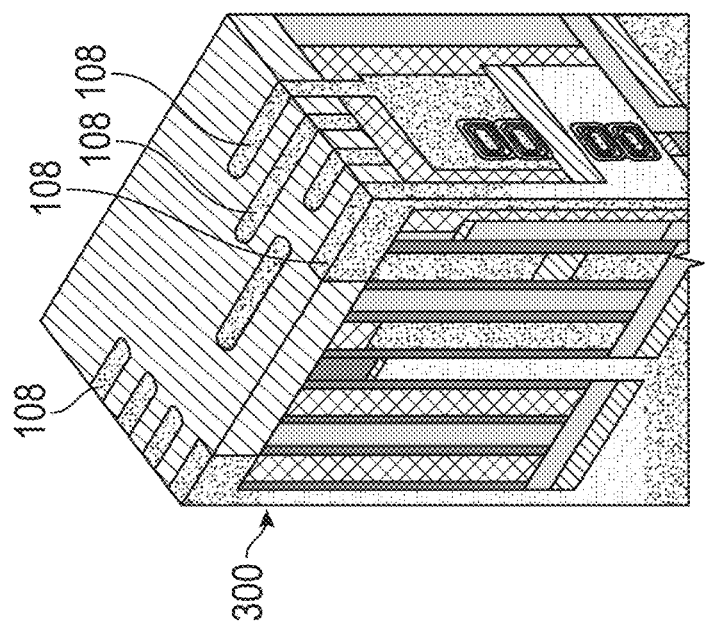
FIG. 9C illustrates an isometric view of a ninth stage of production during a method of producing a target integration structure according to exemplary aspects of the disclosure.
Figure 9B:
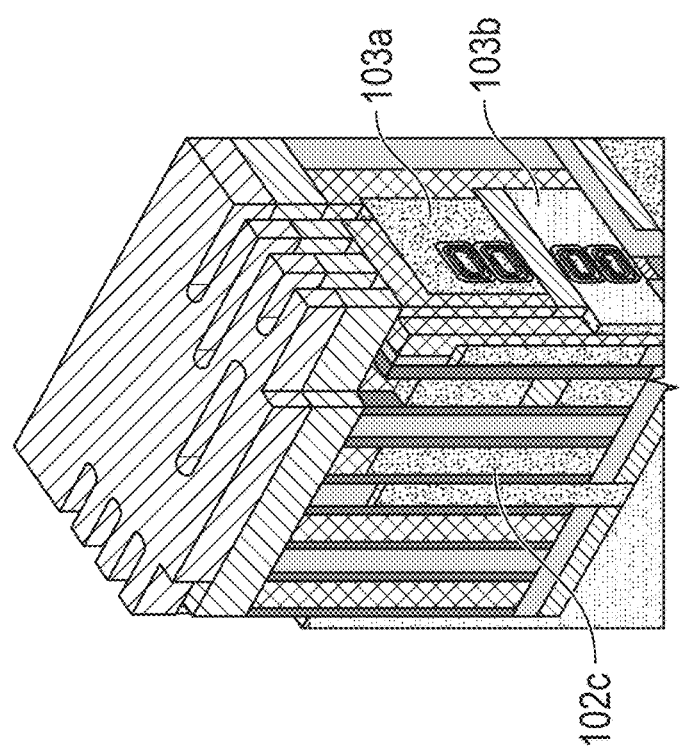
FIG. 9B illustrates an isometric view of an eighth stage of production during a method of producing a target integration structure according to exemplary aspects of the disclosure.
Figure 9A:
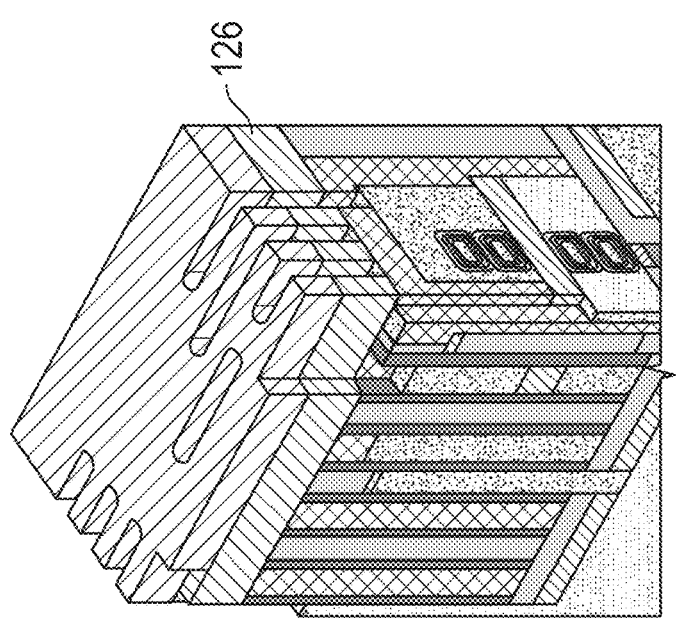
FIG. 9A illustrates an isometric view of a seventh stage of production during a method of producing a target integration structure according to exemplary aspects of the disclosure.

After forming the target structure 200a/200b depicted in FIG. 7C and FIG. 8B (respectively), the middle-of-the-line (MOL) can be formed as depicted in FIGS. 9A-9C.

FIGS. 9A-9C illustrate cross-sectional substrate segments at various stages during the process of forming a third target structure 300. FIG. 9A shows a structure after the gates are capped with a dielectric layer 126 in the replacement metal gate module (RMG, sacrificial cap layer, "sac cap", or "nitride sac cap"). The dielectric layer 126 may be made of, for example, silicon oxide or other dielectric materials. In FIG. 9A, the structure 300 is depicted after a metal layer has been patterned and transferred onto the target structure.

From FIGS. 9B and 9C, it can be seen that the contacts 108 are formed simultaneously for all gates (i.e. the common N & P gates 102c, the bottom gates 103b, and the upper gates 103a) despite the relative differences in height of the top surfaces between each respective gate. That is, as shown in FIG. 9B, the top surfaces of the upper gate 103a and common gates 102c are located at substantially the same height, whereas the top surface of the bottom gates 103b is located at a lower height. Forming proper contact between the gates 103a, 103b, 102c, and the contacts 108 in these different areas relies on the dielectric dry etch control and selectivity during hole formation. Once top surfaces of the common gates 102c and upper gates 103a are exposed, substantial over etching (~4x) is used to continue etching to form the contact hole formation for the bottom gate 103b, with no or limited impact on the already exposed materials of the common gates 102c and upper gates 103a due to high or very high etch selectivity. According to one exemplary aspect, a first etch is selected such that, in areas where bottom gates need to be contacted, the N and P separation dielectric layer will be exposed during the bottom gate poly contact hole formation. That is, the separation dielectric layer 118 acts as an etch stop layer, the etch chemistry can then be switched to open the separation dielectric and provide access the bottom gate 103b. It is noted that, in this exemplary aspect, only one mask for poly contact is used, allowing significant cost reduction, whereas other methods would require more masks and, therefore, increased costs.

Accordingly, techniques described herein provide 3D transistors, including CFET technology, with beneficial features. The features described herein provide independently contacted bottom and/or upper gates (or N & P, P & N, N & N or P & P), while also enabling common bottom and top (or N & P, P & N, etc.) gates. Design functionality is important but equally as important is the technology cost and complexity. Techniques of the exemplary aspects described herein optimize important process integration modules to reduce cost and complexity.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of manufacturing a 3D semiconductor device, the method comprising:
    forming a first target structure, the first target structure including at least one upper gate connected to a first active layer, at least one bottom gate connected to a second active layer, at least one common gate connected to the first active layer and the second active layer, and a dielectric separation layer disposed between and separating the at least one upper gate and the at least one bottom gate;
    simultaneously removing material in at least two of a plurality of material removal areas in the first target structure, the plurality of material removal areas including a first area that extends through the at least one upper gate to a top of the dielectric separation layer, a second area that provides a diffusion break, and a third area that provides a lateral cut that is perpendicular to the at least one common gate, wherein the at least two of the plurality of material removal areas includes at least two of the first area, the second area, and the third area; and
    forming a first contact establishing a first electrical connection to the upper gate and a second contact establishing a second electrical connection to the at least one bottom gate, such that the first contact and second contact are independent of each other.

2. The method of manufacturing according to claim 1, wherein the removing of the material includes simultaneously removing the material in the at least two of the plurality of material removal areas via an etching process.

3. The method of manufacturing according to claim 2, wherein the removing of the material includes simultaneously removing all of the plurality of material removal areas via the etching process.

4. The method of manufacturing according to claim 1,
wherein the at least two of the plurality of material removal areas includes the second area,
wherein the first target structure further includes at least one dummy gate, and
wherein the diffusion break is a single diffusion break that cuts entirely through the at least one dummy gate.

5. The method of manufacturing according to claim 1,
wherein the at least two of the plurality of material removal areas includes the second area and the third area, and
wherein the diffusion break extends perpendicularly to the lateral cut.

6. The method of manufacturing according to claim 1,
wherein the at least two of the plurality of material removal areas includes the third area,
wherein the at least one common gate is spaced from and parallel to both the at least one upper gate and the at least one bottom gate, and
wherein the lateral cut extends downward through the at least one common gate, the at least one upper gate, and the at least one bottom gate to form terminations of each of the respective gates.

7. The method of manufacturing according to claim 1, wherein the forming the first target structure further includes:
forming the at least one bottom gate via metallization;
depositing a dielectric material on top of the at least one bottom gate to form the dielectric separation layer; and
forming the at least one upper gate via metallization.

8. The method of manufacturing according to claim 1,
wherein the at least two of the plurality of material removal areas includes the first area,
wherein the first area provides a vertical cut,
wherein the at least one upper gate includes a first upper gate and a second upper gate,
wherein the vertical cut includes a first vertical cut and a second vertical cut, and
wherein the first vertical cut is formed in the first upper gate and the second vertical cut is formed in the second upper gate.

9. The method of manufacturing according to claim 8, wherein the first vertical cut and second vertical cut are formed on opposite sides of the first active layer.

10. The method of manufacturing according to claim 1, wherein the first contact and second contact extend from a top of the first target structure to the at least one upper gate and at least one bottom gate, respectively.

11. The method of manufacturing according to claim 1,
wherein the at least one upper gate is part of an N-type field-effect-transistor (FET) and the at least one bottom gate is part of a P-type FET; or
wherein the at least one upper gate is part of an P-type FET and the at least one bottom gate is part of an N-type FET.

12. The method of manufacturing according to claim 1, wherein the method further includes forming a third contact establishing a third electrical connection to the at least one common gate.

13. The method of manufacturing according to claim 12, wherein the forming of the third contact, the forming of the first contact, and the forming of the second contact occur simultaneously.

* * * * *

UNITED STATES PATENT AND TRADEMARK OFFICE
CERTIFICATE OF CORRECTION

PATENT NO. : 11,574,845 B2
APPLICATION NO. : 16/848638
DATED : February 7, 2023
INVENTOR(S) : Chanemougame et al.

Page 1 of 1

It is certified that error appears in the above-identified patent and that said Letters Patent is hereby corrected as shown below:

In the Claims

In Column 12, Claim 11, Line 23, delete "an" and insert -- a --, therefor.

Signed and Sealed this
Seventeenth Day of October, 2023

Katherine Kelly Vidal
Director of the United States Patent and Trademark Office